(12) United States Patent
Lee

(10) Patent No.: US 6,271,103 B1
(45) Date of Patent: Aug. 7, 2001

(54) SOLID STATE IMAGE SENSOR AND METHOD FOR FABRICATING THE SAME

(75) Inventor: Chun Tak Lee, Chungcheongbuk-do (KR)

(73) Assignee: LG Semicon Co., Ltd., Chungcheongbuk-Do (KR)

( * ) Notice: Subject to any disclaimer, the term of this patent is extended or adjusted under 35 U.S.C. 154(b) by 0 days.

(21) Appl. No.: 09/366,557

(22) Filed: Aug. 4, 1999

(30) Foreign Application Priority Data

May 14, 1999 (KR) .................................. 99/17384
Jun. 16, 1999 (KR) .................................. 99/22582

(51) Int. Cl.$^7$ ................................. H01L 21/46
(52) U.S. Cl. ................. 438/464; 438/113; 438/460
(58) Field of Search ...................... 438/464, 25, 26, 438/113, 114, 460, 465, 462

(56) References Cited

U.S. PATENT DOCUMENTS

| | | | |
|---|---|---|---|
| 5,641,714 | * 6/1997 | Yamanaka | 438/464 |
| 5,840,614 | * 11/1998 | Sim et al. | 438/464 |
| 5,981,361 | * 11/1999 | Yamada | 438/464 |
| 6,030,485 | * 2/2000 | Yamada | 438/759 |
| 6,140,151 | * 10/2000 | Akram | 438/464 |

\* cited by examiner

Primary Examiner—Kevin M. Picardat
(74) Attorney, Agent, or Firm—Morgan, Lewis & Bockius LLP

(57) ABSTRACT

Solid state image sensor having photodiode regions for converting optical image signal into an electrical signal and charge coupled device regions for transferring video charges generated in the photodiode regions in one direction, including first microlens layers spaced from one another and formed over the photodiode regions to be opposite thereto for focusing lights onto the photodiode regions, and second microlens layers formed of a material having a refractive index greater than the first microlens layers on an entire surface of the first microlens layers for focusing lights incident to edge portions of the first microlens layers and spaces between the first microlens layers onto the photodiode regions.

10 Claims, 6 Drawing Sheets

SOLID STATE IMAGE SENSOR AND METHOD FOR FABRICATING THE SAME

BACKGROUND OF THE INVENTION

1. Field of the Invention

The present invention relates to a solid state image sensor, and more particularly, to a solid state image sensor and a method for fabricating the same, which can improve a device sensitivity and allows an effective individualization of chips.

2. Background of the Related Art

Being a photoelectric conversion device which converts an optical signal into an electric signal, the solid state image sensor is in general provided with a microlens over each of photoelectric conversion area for focusing a light. The focused light is directed onto the photoelectric conversion area, and converted into a video charge corresponding to the directed light. For an effective focusing of the light, a curvature, a refractive index, and a focal distance of the microlens should be precisely controlled. That is, in order to improve a picture taking sensitivity, what should be observed are, first, a precise focusing control of the light onto the photoelectric conversion area, second, an optimization of a microlens curvature, and third, elimination of contamination during formation.

Figure 1:
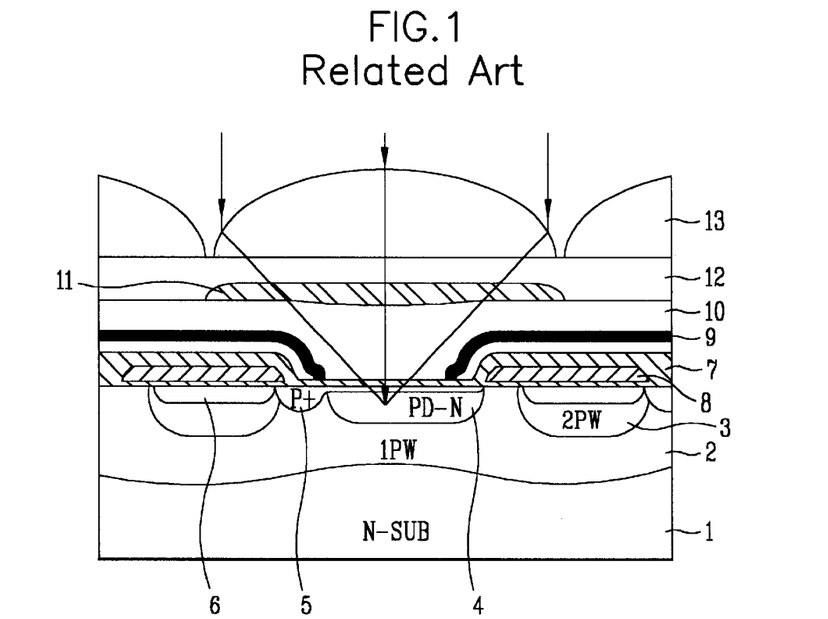
FIG. 1 illustrates a section of a related art solid state image sensor.

A related art solid state image sensor will be explained with reference to the attached drawings. FIG. 1 illustrates a section of a related art solid state image sensor, and FIG. 2 illustrates a system of focal distance calculation of a microlens.

The related art solid state image sensor is provided with a first p type well 2 formed in a surface of an n type semiconductor substrate 1, and a photodiode region 4 formed in the first p type well 2 region. And, there are vertical charge coupled device regions 6 between the photodiode regions 4 in a vertical direction for transferring signal charges generated in the photodiode regions 4 in the vertical direction. There is a second p type well 3 having p type ions implanted therein beneath the vertical charge coupled region 6 for improving a charge transfer efficiency, and there is a channel stop layer 5 between the photodiode regions 4 and the vertical charge coupled regions 6 for electrical separation of the regions. There is a surface $P^+$ layer on a surface of each of the photodiode regions 4 for improving a charge generation efficiency. And, there are polygate electrodes 8 formed repeatedly on the vertical charge coupled device regions 6 insulated by an interlayer insulating layer 7, and there a metal light shielding layer 9 for preventing smear on regions excluding the photodiode regions 4 at which actual light focusing is made. There is a planarizing layer 10 on an entire surface of the metal light shielding layer 9, and a color filter layer 11 on the planarizing layer 10 opposite to each of the photodiode regions 4 for only transmission of a specific wavelength. There is a top coat 12 on an entire surface inclusive of the color filter layer 11, and there is a microlens 13 formed on the top coat 12 opposite to each of the photodiode regions 4.

A focal distance of the aforementioned related art solid state image sensor is determined by the following method.

Figure 2:
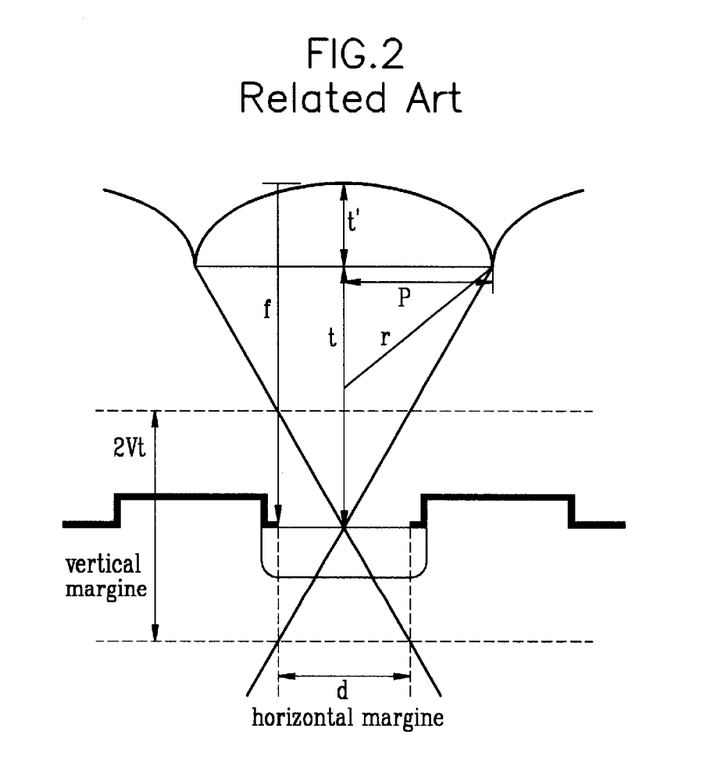
FIG. 2 illustrates a system of focal distance calculation of a microlens.

Referring to FIG. 2, it can be known that the focal distance of the microlens is fixed by a height 't' of the microlens, a distance 't' between a surface of the photodiode and a bottom plane of the microlens, and refractive indices of air and the microlens $n_0$, and $n_1$. For example, if a light is incident to the surface of the photodiode region vertically, the focal distance 'f' is defined as follows.

$$f = \frac{n_1}{n_1 - n_0} \cdot r$$

If 't' denotes a distance from the surface of the photodiode to the bottom plane of the microlens, as $r^2 = p + (®-t')^2$ and t=f-t', the 't' can be expressed as shown below.

$$t = \frac{n_1}{n_1 - n_0} \cdot \frac{p^2 - t'^2}{2t'} - t'$$

Where p is a horizontal distance between cells divided by 2.

Thus, the 't' has a substantial margin, wherein, if a horizontal margin is 'd', a vertical margin Vt can be expressed as dt/2p. Enhancing focusing of light onto the photodiode region by precise focal distance control using the above factors is an important factor in improving the picture taking sensitivity. Other than the focal distance control, optimization of a microlens curvature and a contamination reduction are also important in improving the picture taking sensitivity.

Upon completion of fabrication of the related art solid state image sensor thus, a chip individualization process is proceeded as follows. FIGS. 3A–3F illustrate sections showing the steps of fabrication of the related art solid state image sensor. After completion of device fabrication process done on a wafer, the following packaging process is proceeded.

Figure 3A:
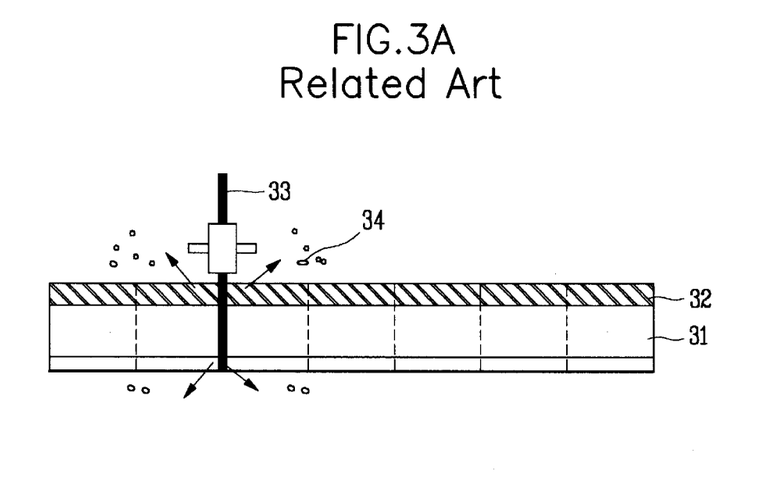
FIGS. 3A~3F illustrate sections showing the steps of a related art method for fabricating a solid state image sensor.
Figure 3B:
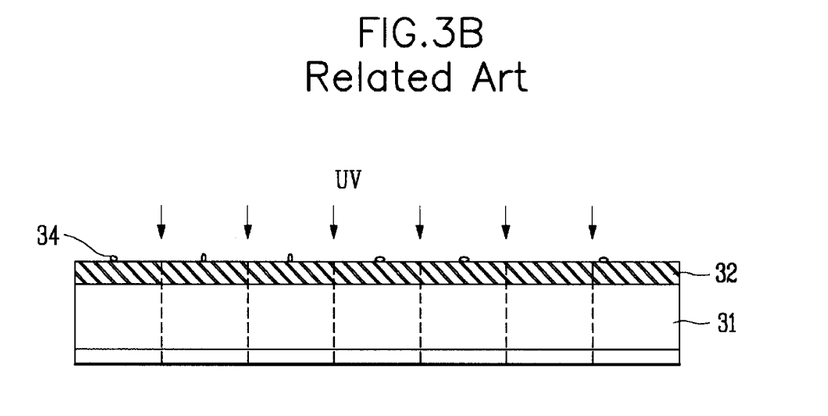
Figure 3C:
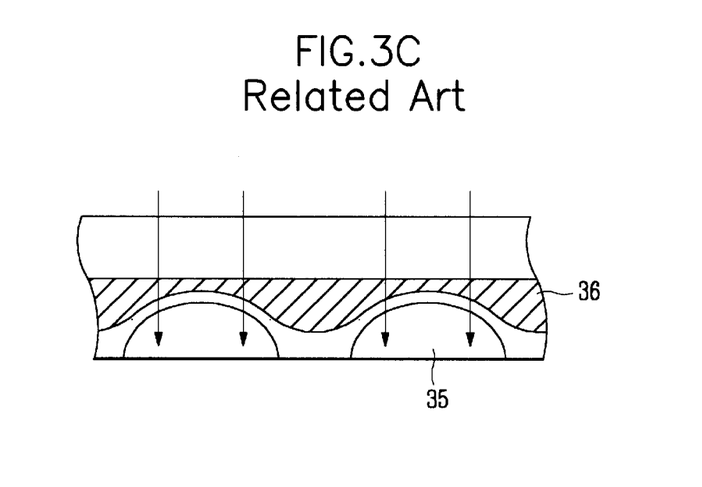
Figure 3D:
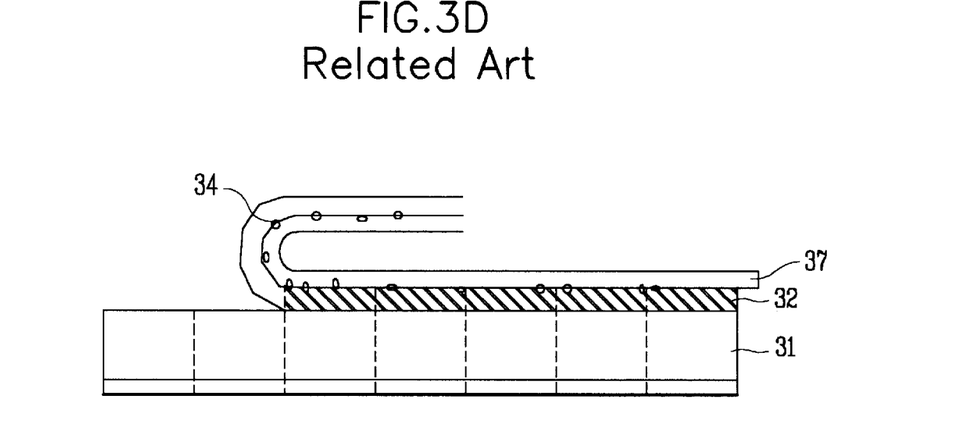
Figure 3E:
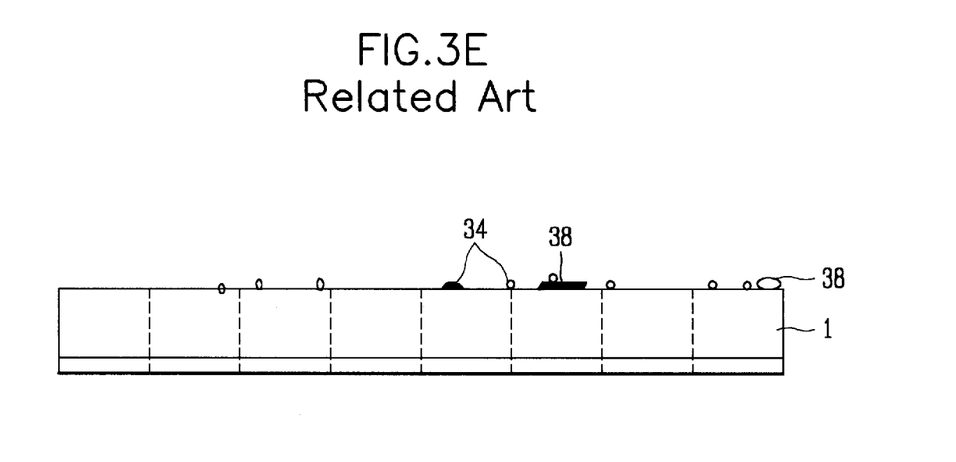
Figure 3F:
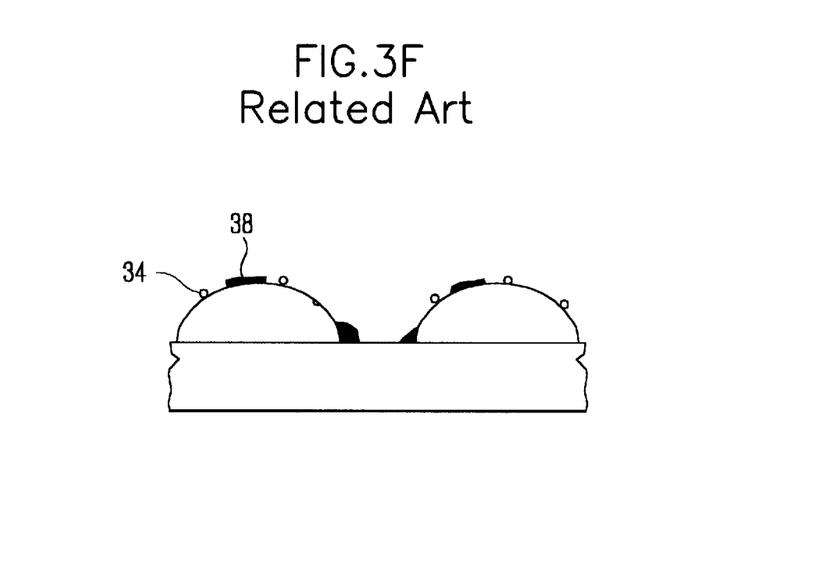

Referring to FIG. 3A, after a UV tape 32 is attached to an entire surface of the wafer 31 having individual chips fabricated thereon, the wafer is subjected to die sawing along a scribe line in the wafer 31 using a sawing machine 33. Foreign matters 34 in a nature of a resin fallen off from the UV tape 32 during the die sawing are present on a surface of the wafer 31. Then, as shown in FIG. 3B, a UV ray is directed to the chip of which die sawing is completed for easy removal of the chip from the UV tape 32. As shown in FIG. 3C which illustrates a partially enlarged section of an individual chip portion, the direction of UV ray hardens an adhesive composition 36 in the UV tape 32 in contact with the microlens, which weakens an adhesive force of the adhesive composition 36. An initial adhesive force of the adhesive composition on the UV tape 32 is in a range of 300–400 g/25 mm. It is found that the direction of UV ray to the UV tape in a non-actual fabrication state reduces the adhesive force down to 1–30 g/25 mm. However, the reduction of the adhesive force in an actual fabrication is not so great, but is in a range of 50–100 g/25 mm. Because the microlens is formed of a resin of a polyimide group, and the adhesive composition on the UV tape is a photoresist resin of the same group. As shown in FIG. 4D, after a remove tape 37 is attached to the UV tape 32 used for supporting the chip in the die sawing, the UV tape 32 attached to the surface of the wafer 31 is removed using the remove tape 37. As shown in FIG. 3E, because the UV tape 32 is removed in a state a complete hardening of the adhesive composition is not fulfilled, there are foreign matters 34 in a nature of resin from the UV adhesive agent and particles 38 of the UV tape are present on the surface of the wafer 31. As shown in FIG. 3F which is a partially enlarged view centered on the microlens 35, those foreign matters are still present even in an individual chip state after finish of the die sawing.

The aforementioned related art solid state image sensor has the following problems.

First, there is a limitation in focusing a light because the focusing is fully dependent on a refraction of the microlens in the process that the light is focused through the microlens and directed to the photodiode. This limitation comes from a limitation of a refractive index of a material of the microlens itself and a limitation of a refractive index of the microlens coming from different fabrication conditions considering the curvature and the like.

Second, there is a gap of approx. 2 μm provided between adjacent microlenses for obtaining a required curvature of the microlens. If the gap is not provided, but the microlenses are formed bringing the microlenses to full contact, there will be a deep groove formed between adjacent microlenses, which makes removal of the foreign matters difficult. The light incident to the gap of the microlenses is not focused by the microlenses. Accordingly, the presence of gap between the microlenses drops an effective light focusing efficiency.

Third, though the adhesive force of the UV tape should be reduced in the UV tape removal step for die attachment after the die sawing, the reduction of the adhesive force is difficult because the UV tape is formed of a polyimide group identical to a material of the microlens, to leave foreign matters in a nature of resin, silicon dusts, and UV tape debris on the microlens in the UV tape removal step using the remove tape, which causes formation of scratch on the microlens.

The related art solid state image sensor has a low sensitivity and yield caused by the above problems.

SUMMARY OF THE INVENTION

Accordingly, the present invention is directed to a solid state image sensor and a method for fabricating the same that substantially obviates one or more of the problems due to limitations and disadvantages of the related art.

An object of the present invention is to provide a solid state image sensor and a method for fabricating the same, which can improve a device sensitivity, suppress formation of contaminants in a chip individualization process, and permits easy removal of the contaminants.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the solid state image sensor having photodiode regions for converting optical image signal into an electrical signal and charge coupled device regions for transferring video charges generated in the photodiode regions in one direction, includes first microlens layers spaced from one another and formed over the photodiode regions to be opposite thereto for focusing lights onto the photodiode regions, and second microlens layers formed of a material having a refractive index greater than the first microlens layers on an entire surface of the first microlens layers for focusing lights incident to edge portions of the first microlens layers and spaces between the first microlens layers onto the photodiode regions.

In other aspect of the present invention, there is provided a method for fabricating a solid state image sensor including the steps of (1) attaching a UV tape on a wafer after forming first microlens layers opposite to photodiode regions respectively and second microlens layers on an entire surface inclusive of the first microlens layers, (2) subjecting the wafer to die sawing along a scribe line on the wafer for individualization of devices, (3) directing a UV ray onto an entire surface of the wafer directly, to harden an adhesive composition on the UV tape for the first time, and to harden the adhesive composition again by the UV ray reflected at the second microlens layer, and (4) attaching a remove tape on the UV tape passed through the step (3) and removing the UV tape and foreign residual matters using the remove tape.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 4:
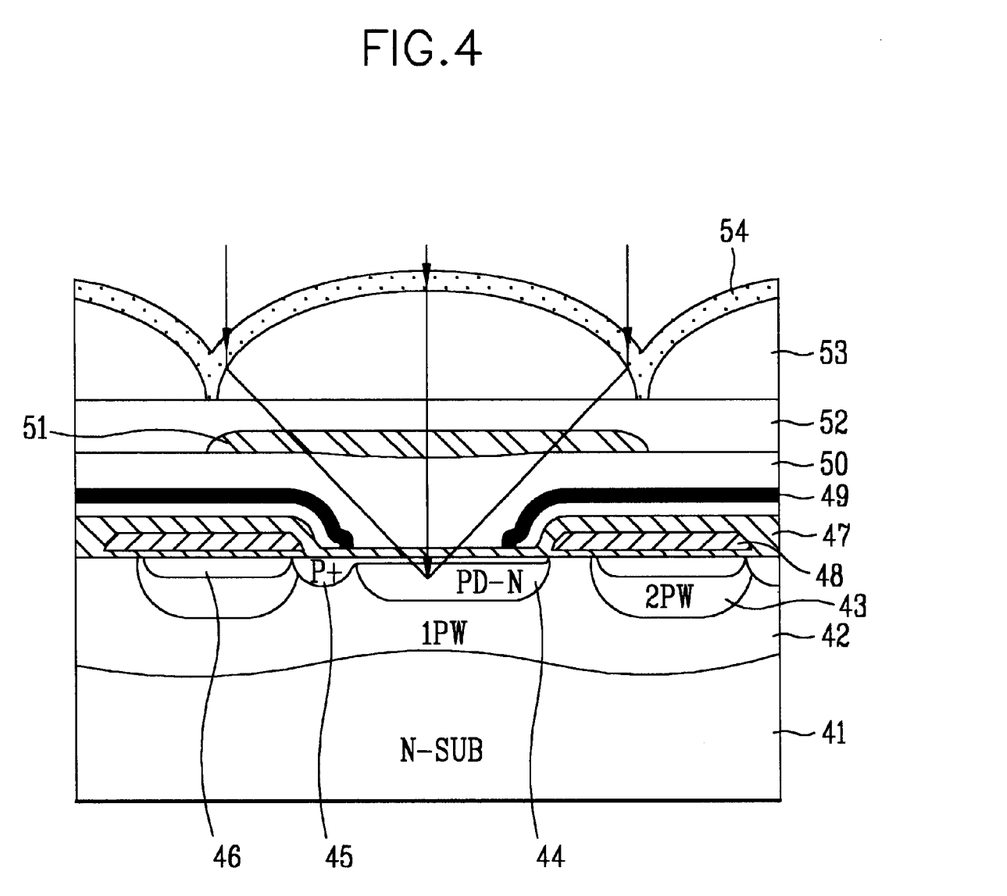
FIG. 4 illustrates a section of a solid state image sensor in accordance with a preferred embodiment of the present invention; and, FIGS. 5A~5F illustrate sections showing the steps of a method for fabricating a solid state image sensor in accordance with a preferred embodiment of the present invention.

Reference will now be made in detail to the preferred embodiments of the present invention, examples of which are illustrated in the accompanying drawings. FIG. 4 illustrates a section of a solid state image sensor in accordance with a preferred embodiment of the present invention. The solid state image sensor of the present invention suggests formation of a first microlens layer under appropriate curvature, gap and focal distance control and formation of a second microlens layer of a protection film which permits easy removal and suppression of the foreign matters in a following package process.

Referring to FIG. 4, the solid state image sensor in accordance with a preferred embodiment of the present invention includes a first p type well 42 formed in a surface of an n type semiconductor substrate 41, and a photodiode region 44 formed in the first p type well 42 region. And, there are vertical charge coupled regions 46 formed between the photodiode regions 44 in a vertical direction for transfer of signals generated in the photodiode regions 44 in the vertical direction. There is a second p type well 43 having p type ions implanted therein formed beneath each of the vertical charge coupled regions 46 for improving a charge transfer efficiency, and there is a channel stop layer 45 between the photodiode regions 44 and the vertical charge coupled regions 46 for electrical separation of each of the regions. There is a surface $p^+$ layer formed on a surface of each of the photodiode regions 44 for improving a charge generation efficiency. There are polygate electrodes 48 formed insulated by an interlayer insulating layer 47 repeatedly on the vertical charge coupled regions 46 and a metal light shielding layer 49 on regions excluding the photodiode regions 44 which actually focus lights for preventing smear. There are a planarizing layer 50 formed on an entire surface having the metal light shielding layer 49 formed thereon, and a color filter layer 51 on the planarizing layer 50 at each position opposite to each of the photodiode regions 44 for transmission of a light in a specific wavelength range only. There are a top coat 52 on an entire surface inclusive of the color filter layer 51, and a bilayered microlens layer formed on the top coat 52 at a position opposite to each of the photodiode regions 44 for focusing the light incident to the top coat 52. First, taking the focal distance, curvature and a gap between the microlenses into consideration, a first microlens layer 53 is formed. The first microlens layer 53 is formed by coating a microlens resin, patterning the microlens resin coating to be opposite to each photodiode region, and subjecting the patterned microlens resin coating to thermal reflowing. Then, a second microlens layer 54 of nitride (P-SiN) layer deposited by a plasma CVD (Chemical Vapour Deposition) is formed on an entire surface having the first microlens layer 53 formed thereon. The second microlens layer 54 has a thickness of 100~10000 Å. The second microlens layer 54 may be formed of any transparent material with a refractive index to a light equal to or higher than 1 other than the nitride. The refractive index of the first microlens layer 53 is in a range of 1.4~1.5, and the refractive index of the second microlens layer 54 of the nitride is in a range of 1.9~2.0. As another embodiment, when the second microlens layer 54 is formed of P-SiO among materials with an refractive index equal to or higher than 1, the second microlens layer has a refractive index ranging 1.5~1.7. The second microlens layer 54 acts as a protection film for protecting the first microlens layer 53 in a following package process. And, since the second microlens layer 54 is formed on the entire surface, the second microlens layer 54 can make an effective focusing both of the light incident to the gap between the first microlens layers 53 and the light incident to edges of the first microlens layers 53. Moreover, the second microlens layer 54 reduces the adhesive force of the UV tape used in the following individualization of the chip, and suppresses formation of foreign matters in the die sawing.

A packaging process using the second microlens layer 54 as a protection film will be explained. FIGS. 5A~5F illustrate sections showing the steps of a method for fabricating a solid state image sensor in accordance with a preferred embodiment of the present invention.

Figure 5A:
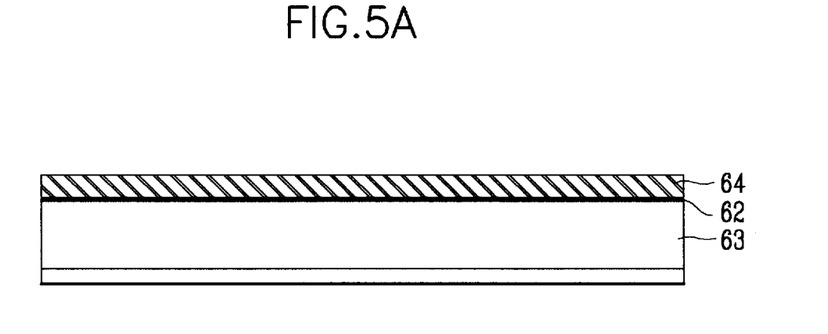
Figure 5B:
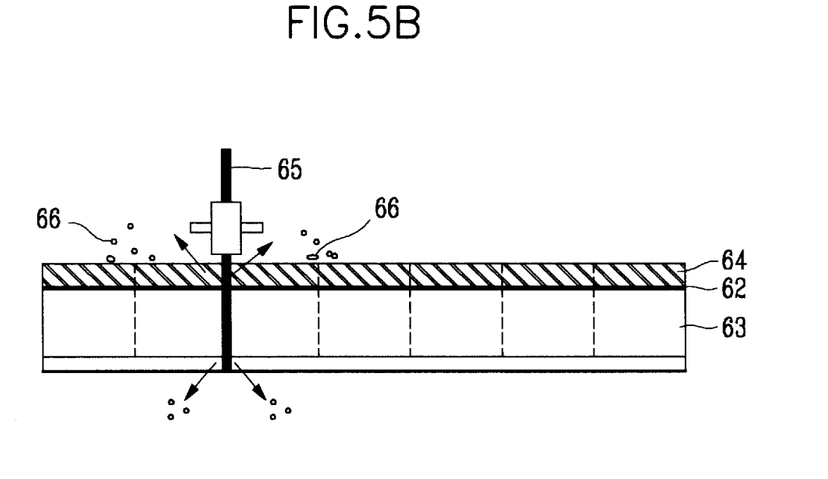
Figure 5C:
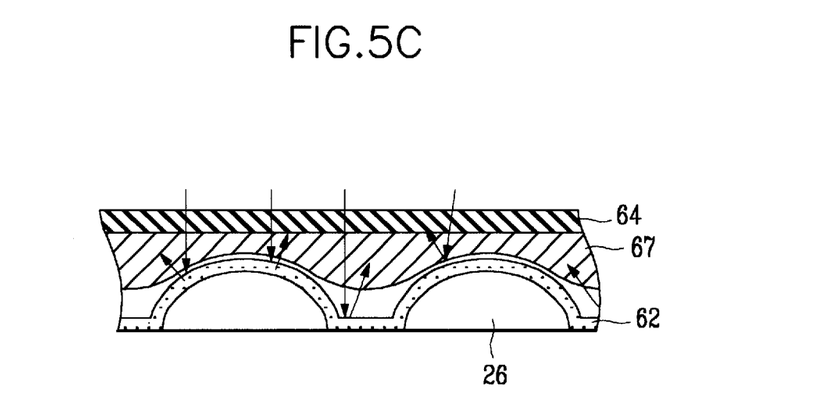
Figure 5D:
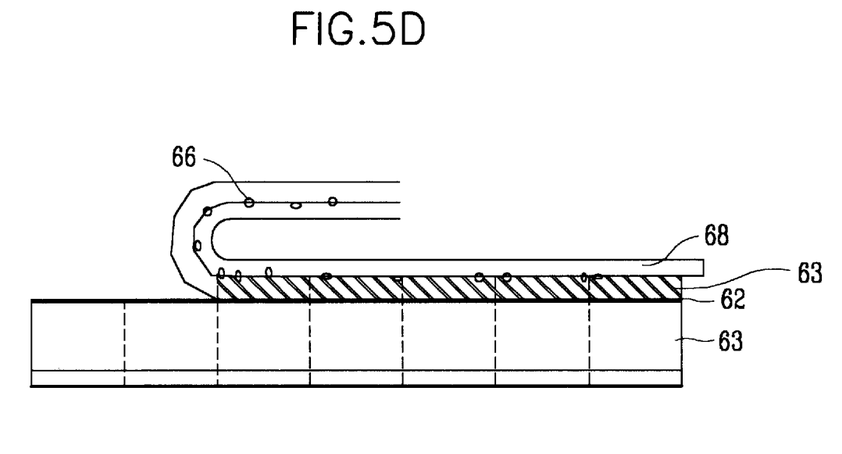
Figure 5E:
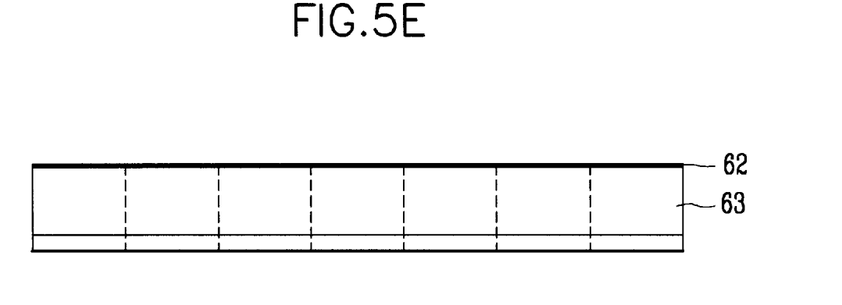
Figure 5F:
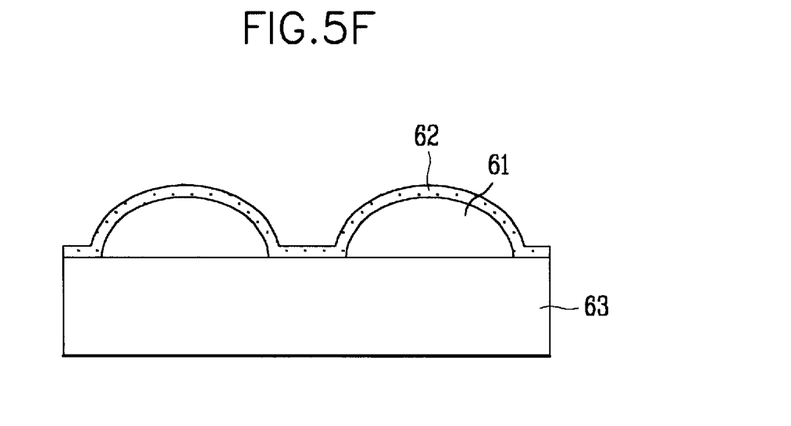

Referring to FIG. 5A, the method for fabricating a solid state image sensor in accordance with a preferred embodiment of the present invention starts with attaching a UV tape 64 on a wafer 63 having CCD individual chips, including first microlens layers 61 each formed at a position opposite to each of photodiode regions taking a focal distance, a curvature and a gap between the microlenses into consideration, and a second microlens layer 62 of a transparent material with a refractive index greater than the first microlens layer 61. The first microlens layer 61 is formed by coating a microlens resin, patterning the microlens resin coating to be opposite to each photodiode region, and subjecting the patterned microlens resin coating to thermal reflowing. And, the second microlens layer 62 is formed of nitride (P-SiN) by a plasma CVD. The P-SiN layer is deposited in an $N_2$ gas ambient using $NH_3$ and $SiH_4$ as a reaction gas at a temperature of 150~200 °C. under 2.7 torr for 9~10 sec to a thickness of 100~10000 Å. The second microlens layer 62 may be formed of any transparent material with a refractive index to a light equal to or higher than 1 other than the nitride layer. The refractive index of the first microlens layer 61 is in a range of 1.4~1.5, and the refractive index of the second microlens layer 54 of the nitride is in a range of 1.9~2.0. As another embodiment, when the second microlens layer 62 is formed of P-SiO among materials with an refractive index equal to or higher than 1, the second microlens layer has a refractive index ranging 1.5~1.7. Then, as shown in FIG. 5B, the wafer 63 is subjected to die sawing along a scribe line in the wafer 62 using a sawing machine 65, thereby separating individual chips. In cutting the UV tape 64, foreign matters 66 in a nature of resin is produced. As shown in FIG. 5C, a UV ray is directed onto an entire surface of the wafer 63 individualized by the die sawing. FIG. 5C illustrates an enlarged view of a section of the individualized chip. The UV directed to the wafer 63 directly in the UV direction step hardens an adhesive composition for the first time, and a UV ray reflected at the second microlens layer 62 hardens the adhesive composition for the second time. This hardening process of the adhesive composition reduces the adhesive force from 300~400 g/25 mm down to 1~10 g/25 mm. Then, as shown in FIG. 5D, a remove tape 68 is attached to the UV tape 64 passed through the adhesive composition 67 hardening step by the UV ray direction, and the UV tape 64 attached to a surface of the wafer 63 and foreign matters 66 in a nature of resin present on the UV tape 64 are removed using the remove tape 68. As the adhesive composition 67 on the UV tape 64 is hardened adequately in the UV tape 64 removal step, which weakens the adhesive force substantially, the UV tape 64 is removed from the surface of the wafer 63, readily. It can be known from FIGS. 5E and 5F that there are no foreign matters in a nature of resin and residue of the UV tape left on the surface of the wafer 63 after removal of the UV tape 64. FIG. 5F illustrates a partially enlarged view of a section of the device after the UV tape 64 is removed. There are no foreign matters in a nature of resin and residue of the UV tape left on the second microlens layer 62 because the adhesive composition 67 of the UV tape 64 is hardened smoothly and an adsorptive force between the foreign matters 66 in a nature of resin and the second microlens layer 62 is small as the second microlens layer 62 is formed of a material in a group different from the UV tape 64 on an entire surface. As following fabrication processes, a die attachment process for attaching the chip individualized by the die sawing to a ceramic substrate, a die bonding process for electrical wiring of the chip, sealing the chip, and the like are proceeded, to complete fabrication of the solid state image sensor(not shown).

The solid state image sensor and the method for fabricating the same have the following advantages.

First, as focusing of a light incident to the photodiode region is made by the second microlens layer which focuses lights incident to the first microlens layer, the edge portions, and the gap portion, a light focusing efficiency can be improved.

Second, because the second microlens layer is formed of material with a great refractive index in a gap between adjacent first microlens layers, the gap between microlenses can be optimized, thereby permitting the first microlens to secure a required curvature with easy and eliminating a possibility of contaminants left on the microlens by optimizing the gap even if a groove between the first microlenses becomes deeper.

Third, because the second microlens layer, which is formed on an entire surface, can correct size and shape irregularities of the microlens occurred in the thermal reflowing in the formation of the first microlens layer, a yield can be improved.

Fourth, since the second microlens layer acts as a protection film in a step of transporting a wafer for packaging after FAB out, a possibility of occurrence of defects is reduced.

Fifth, because the UV directed to the wafer directly in the UV direction step which is conducted for die attachment after the die sawing hardens an adhesive composition for the first time, and a UV ray reflected at the second microlens layer hardens the adhesive composition for the second time, removal of the UV tape and foreign matters is easy, that prevents the foreign matters in a nature of resin, silicon dusts, and UV tape debris from being left on the device surface, whereby suppressing occurrence of defects, such as white defects.

Sixth, as the second microlens layer is formed of a material which is not adsorptive to foreign matters fallen off in the die sawing and from the UV tape, re-deposition of the foreign matters is prevented.

Seventh, the second microlens layer acts as a protection film, to prevent occurrence of scratch in the die sawing and the wafer transportation.

It will be apparent to those skilled in the art that various modifications and variations can be made in the solid state image sensor and a method for fabricating the same of the present invention without departing from the spirit or scope of the invention. Thus, it is intended that the present invention cover the modifications and variations of this invention provided they come within the scope of the appended claims and their equivalents.

What is claimed is:

1. A method for fabricating a solid state image sensor comprising the steps of:
    (1) attaching a UV tape on a wafer after forming first microlens layers opposite to photodiode regions respectively and second microlens layers on an entire surface inclusive of the first microlens layers;
    (2) subjecting the wafer to die sawing along a scribe line on the wafer for individualization of devices;
    (3) directing a UV ray onto an entire surface of the wafer directly, to harden an adhesive composition on the UV tape for the first time, and to harden the adhesive composition again by the UV ray reflected at the second microlens layer; and,
    (4) attaching a remove tape on the UV tape passed through the step (3) and removing the UV tape and foreign residual matters using the remove tape.

2. A method as claimed in claim 1, wherein the second microlens layer is formed of a material having a refractive index greater than the first microlens layer.

3. A method as claimed in claim 1, wherein the first microlens layer is formed of a material having a refractive index in a range of 1.4~1.5, and the second microlens layer is formed of a material having a refractive index in a range of 1.9~2.0.

4. A method as claimed in claim 1, wherein the first microlens layer is formed by coating a microlens resin, patterning the coated microlens resin to be opposite to the photodiode regions, and subjecting to thermal reflow.

5. A method as claimed in claim 1, wherein the second microlens layer is a nitride (P-SiN) layer formed by plasma CVD.

6. A method as claimed in claim 5, wherein the P-SiN layer is deposited in an $N_2$ gas ambient using $NH_3$ and $SiH_4$ as a reaction gas at a temperature of 150~200° C. under 2.7 torr for 9~10 sec.

7. A method as claimed in claim 5, wherein the second microlens layer has a thickness of 100~10000 Å.

8. A method as claimed in claim 1, wherein the second microlens layer is formed of a transparent material having a refractive index to light equal to or greater than unity.

9. A method as claimed in claim 8, wherein the second microlens layer is formed of P-SiO as one of materials having a refractive index to light greater than unity such that the second microlens layer has a refractive index in a range of 1.5~1.7.

10. A method as claimed in claim 1, wherein the step (3) causes an adhesive force of the UV tape to be in a range of 1~10 g/25 mm.

* * * * *